United States Patent
Chen

(10) Patent No.: US 10,366,760 B1
(45) Date of Patent: Jul. 30, 2019

(54) NAND FLASH MEMORY WITH WORLDLINE VOLTAGE COMPENSATION USING COMPENSATED TEMPERATURE COEFFICIENTS

(71) Applicants: GigaDevice Semiconductor (Shanghai) Inc., Shanghai (CN); GigaDevice Semiconductor (Beijing) Inc., Beijing (CN); GigaDevice Semiconductor (Hefei) Inc., Hefei (CN)

(72) Inventor: Minyi Chen, San Jose, CA (US)

(73) Assignees: GigaDevice Semiconductor (Shanghai) Inc., Shanghai (CN); GigaDevice Semiconductor (Beijing) Inc., Beijing (CN); GigaDevice Semiconductor (Hefei) Inc., Hefei (CN)

( * ) Notice: Subject to any disclaimer, the term of this patent is extended or adjusted under 35 U.S.C. 154(b) by 0 days.

(21) Appl. No.: 15/871,133

(22) Filed: Jan. 15, 2018

(51) Int. Cl.
  *G11C 7/04* (2006.01)
  *G11C 16/08* (2006.01)
  *G11C 16/04* (2006.01)

(52) U.S. Cl.
  CPC .......... *G11C 16/08* (2013.01); *G11C 16/0483* (2013.01)

(58) Field of Classification Search
  CPC ....... G11C 16/08; G11C 16/0483; G11C 7/04; G11C 8/081; G11C 16/26
  See application file for complete search history.

(56) References Cited

U.S. PATENT DOCUMENTS

| | | | |
|---|---|---|---|
| 7,342,831 B2 * | 3/2008 | Mokhlesi | G11C 7/04 365/185.21 |
| 2014/0269070 A1 * | 9/2014 | Hsiung | G11C 16/26 365/185.11 |
| 2017/0371559 A1 * | 12/2017 | Higgins | G06F 3/0611 |

* cited by examiner

*Primary Examiner* — David Lam
(74) *Attorney, Agent, or Firm* — Gokalp Bayramoglu

(57) ABSTRACT

The present application provides a NAND flash memory with wordline voltage compensate, including wordlines. Each wordline corresponds to a wordline voltage with a compensated temperature coefficient. The wordlines are divided into a plurality of groups, each group corresponds to a compensated temperature coefficient. Each wordline corresponds to a wordline address, and the groups of wordlines are divided by at least a border according to wordline addresses, or divided by zones having fixed number of wordlines.

4 Claims, 2 Drawing Sheets

NAND FLASH MEMORY WITH WORDLINE VOLTAGE COMPENSATION USING COMPENSATED TEMPERATURE COEFFICIENTS

TECHNICAL FIELD

The present application generally relates to the NAND flash memory technical field and, more particularly, to a NAND flash memory with wordline voltage compensate.

BACKGROUND

Flash memory is an electronic (solid-state) non-volatile computer storage medium that can be electrically erased and reprogrammed. The NAND flash memory is a main type of flash memory named after the NAND logic gates, it has advantages of fast programming and short erasing time.

The NAND flash array is composed of a plurality of memory cells. Each memory cell stores a binary code 0 or 1. Several memory cells form a "word". An address decoder of the NAND flash array includes n address output lines A0~An−1 and 2n decoder output lines W0~W2n−1. The decoder output line Wi is called a "wordline" and corresponds to a word in the storage array.

Basic operations to the NAND flash memory includes erase operation, program operation and read operation. The erase operation is operated block by block, all the memory cells in the block are erased, and the data in the memory cells are 1 after erase. The program operation is operated page by page, whether to program the page is determined according to the input data 0 or 1. When the input data is "0", program is performed; when the input data is "1", program is not performed. Read operation is to apply a wordline voltage in the gate of the memory cell, and test the current on the memory cell, when the read current is less than a reference current, the data stored in the memory cell is determined to be "0", and when the read current is larger than a reference current, the data stored in the memory cell is determined to be "1".

A threshold voltage of the memory cell of the NAND flash memory varies with temperature, which is around −1.5 mV/° C. In the conventional technology, when performing a read operation on the NAND flash memory, a constant voltage without varying with temperature is usually applied to the wordline. As a result, it may lead to read error, for example, "1" may be read as "0" under low temperature, and "0" may be read as "1" under high temperature.

A temperature coefficient (Tco) describes the relative change of a physical property that is associated with a given change in temperature. In NAND flash memory, for the above reason, a compensate voltage with a temperature coefficient is applied to wordlines to compensate the read voltage and program verify voltage of a wordline. In the conventional technology, the temperature coefficient is fixed, and then the compensate voltage applied to the wordlines are fixed.

However, the compensate voltage with the fixed temperature coefficient may not be suitable to all the wordlines, it may lead to over-compensate and under-compensate, which may generate error on the operation of wordlines.

SUMMARY

As an improvement, there is provided a NAND flash memory with wordline voltage compensate, which may overcome or at least partially solve or mitigate above problems.

According to an aspect of the present invention, there is disclosed a NAND flash memory with wordline voltage compensate, comprising: a plurality of wordlines, wherein each of the plurality of wordlines corresponds to a wordline voltage with a compensated temperature coefficient, wherein the plurality of wordlines are divided into a plurality of groups, each group corresponds to the compensated temperature coefficient.

According to an embodiment, the each wordline corresponds to a wordline address, and the groups of wordlines are divided by at least a border according to wordline addresses.

According to an embodiment, the plurality of wordlines are divided into three groups by two borders, each of the three groups corresponds to the compensate temperature coefficient.

According to an embodiment, the groups of wordlines are divided by zones, each zone includes at least one wordline.

According to an embodiment, said each zone includes 16 wordlines, and four zones are applied.

According to an embodiment, the NAND flash memory comprises power-on read blocks, the power-on read blocks store enable parameters for enabling or disabling the compensated temperature coefficient.

According to an embodiment, the enable parameters include a border enable parameter and a zone enable parameter.

According to an embodiment, the border enable parameter and the zone enable parameter are not enabled at a same time.

As discussed above, in the present invention, the NAND flash memory with wordline voltage compensate are disclosed. By providing Tco border or Tco zone with respect to wordline addresses, the invention may achieve flexible compensate to different wordlines. The read voltage and program verify voltage may be more accurate, and then error may be avoided during operation of wordlines.

The above description is merely an overview of technical solutions of the present application. In order to more clearly understand the technical solutions of the present application to implement in accordance with the contents of the description, and to make the foregoing and other objects, features and advantages of the application more apparent, detailed embodiments of the application will be provided below.

BRIEF DESCRIPTION OF THE DRAWINGS

Through reading the detailed description of the following preferred embodiments, various other advantages and benefits will become apparent to those of ordinary skills in the art. Accompanying drawings are merely included for the purpose of illustrating the preferred embodiments and should not be considered as limiting of the application. Further, throughout the drawings, like elements are indicated by like reference numbers.

DETAILED DESCRIPTION OF EMBODIMENTS

Exemplary embodiments of the present application will be described in detail with reference to the accompanying drawings hereinafter.

Figure 1:
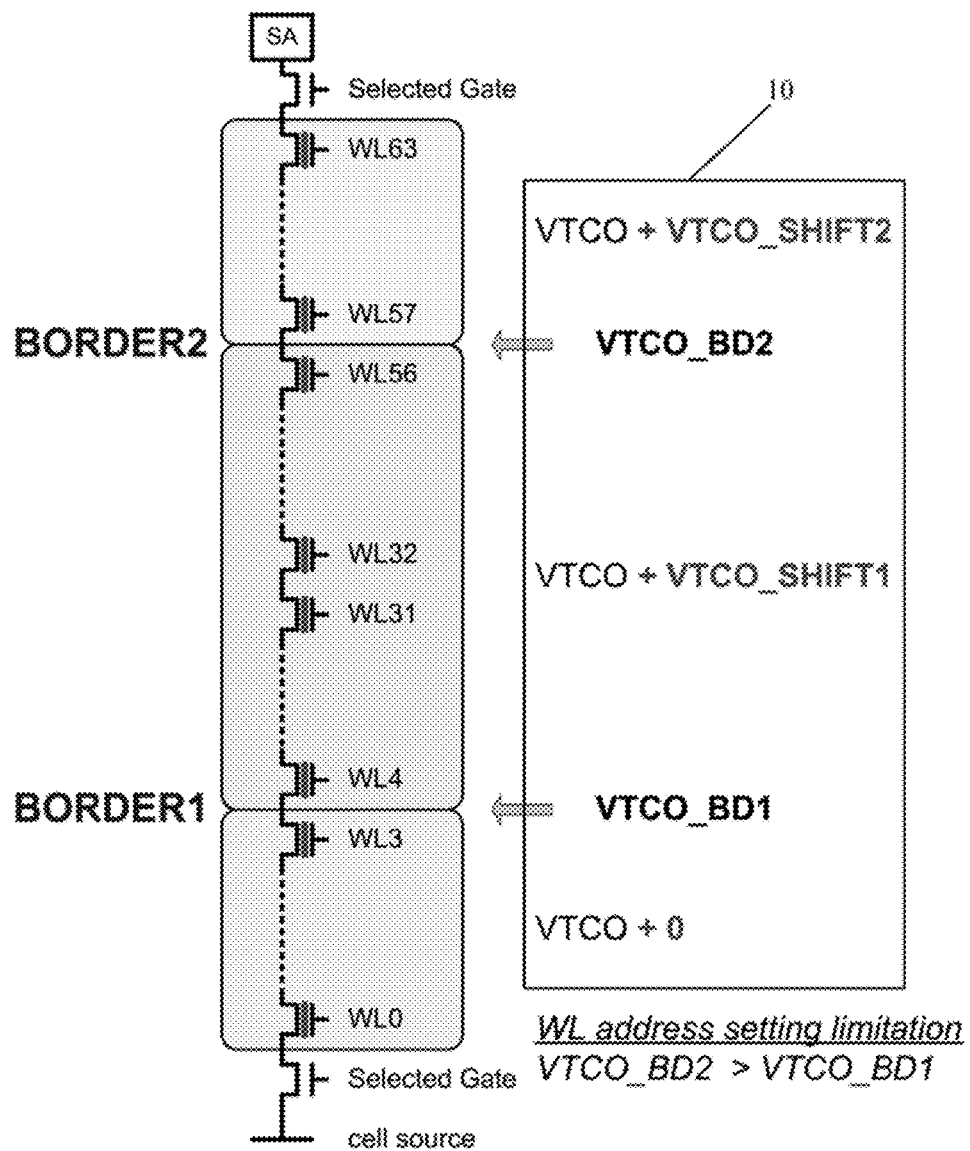
FIG. 1 is a schematic diagram showing variable Tco borders according to an embodiment of the present invention.

FIG. 1 is a schematic diagram showing variable Tco borders according to an embodiment of the present invention.

As shown in FIG. 1, with respect to 64 wordlines WL0 to WL63, two variable Tco borders, which are VTCO_BD1 and VTCO_BD1 are disposed for setting flexible temperature coefficients.

Figure 2:
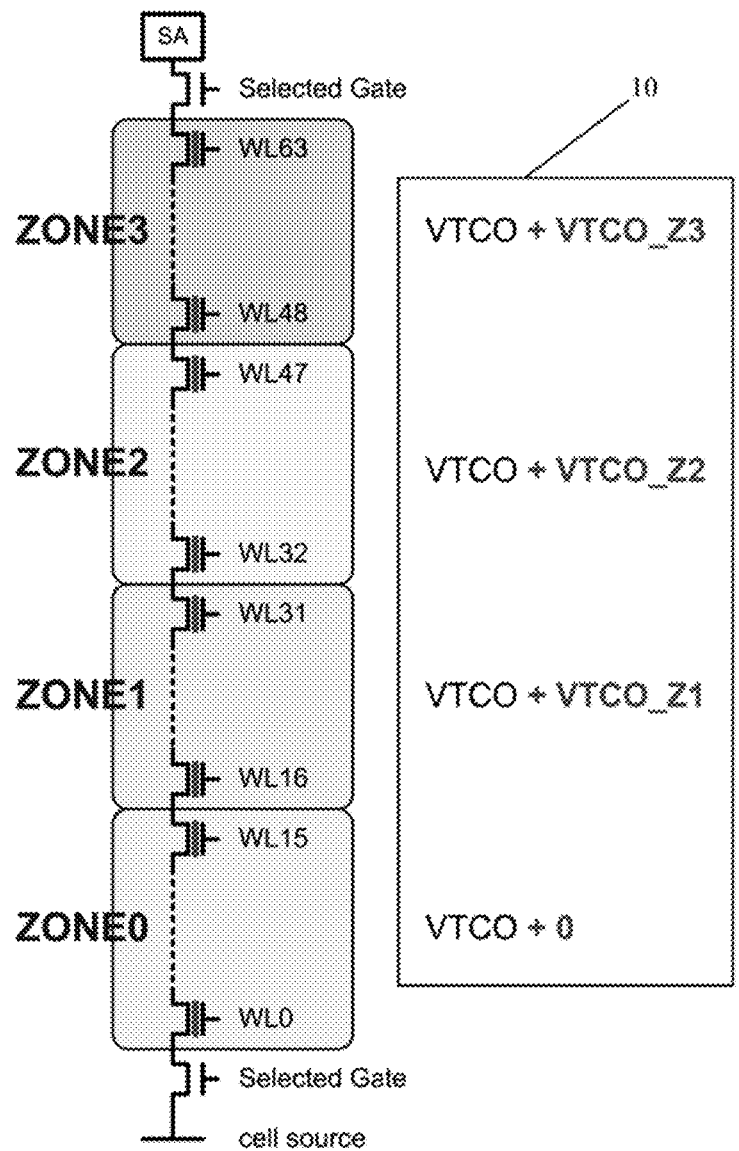
FIG. 2 is a schematic diagram showing variable Tco zones according to an embodiment of the present invention.

The two Tco borders are used to divide the wordlines into three areas according to wordline addresses. In the embodiment, the wordlines under the VTCO_BD1, which are WL0 to WL3 are in the first area; the wordlines between the VTCO_BD1 and VTCO_BD2 which are WL4 to WL56 are in the second area; and the wordlines above the VTCO_BD2 which are WL57 to WL63 are in the third area. As shown in FIG. 2, VTCO_BD2 is large than VTCO_BD1.

Which area is a wordline located may be determined by a determining procedure when the NAND flash memory is powered on. For example, in the determining procedure, a comparison is performed between the wordline address of the wordline and corresponding address scope of the border. After comparison, the area in which the wordline is located it is determined.

In the first area, Tco compensate parameter may be set as 0, and in the second area, Tco compensate parameter may be represented by "VTCO_SHIFT1" and in the third rea, Tco compensate parameter may be represented by "VTCO_SHIFT2".

VTCO_SHIFT1 and VTCO_SHIFT2 may be positive or negative, which are not limited. VTCO_SHIFT1 and VTCO_SHIFT2 may be determined in factory test. Hereinafter, an example for determining the Tco in factory test is illustrated.

In an embodiment, in the factory test period, the Tco compensate parameter for read voltage and the Tco compensate parameter for program verify voltage of a wordline under different temperatures are tested.

As the first step, under a certain temperature such as 85° C., the optimum voltage V2 at which the wordline works with best performance is tested. After the optimum voltage V2 is obtained, in the second step, a plurality of temperatures, such as −40° C., 25° C. and 85° C. are selected. In the third step, the Tco compensate parameter under each selected temperature is calculated based on the optimum voltage V2 and the initial voltage V1 of the wordline. For example, the calculating formula may be: V2=V1+f(Tco). Wherein the function f is predetermined or fitted by parameters during test process. The value f(Tco) may be positive or negative, which is not illustrated thereto.

That is, with respect to one wordline, each selected temperature corresponds to a read voltage and a program verify voltage. Table 1 herein below shows the parameters $T_{11}$ to $T_{31}$ under each selected temperature.

TABLE 1

| temperature | Tco compensate parameter for read voltage | Tco compensate parameter for Program verify voltage |
|---|---|---|
| −40° C. | $Tco_{11}$ | $Tco_{12}$ |
| 25° C. | $Tco_{21}$ | $Tco_{22}$ |
| 85° C. | $Tco_{31}$ | $Tco_{32}$ |

The Tco compensate parameters $Tco_{11}$ to $Tco_{32}$ represent the corresponding compensated temperature coefficients under each selected temperature to achieve the corresponding standard voltage. To a certain temperature, the Tco compensate parameter for read voltage may be the same as the Tco compensate parameter for program verify voltage. After obtained, the Tco compensate parameters are stored in power-on read blocks 10, which is used to store power-on boot code, of the NAND flash memory.

As a result, when the NAND flash memory is operated under certain temperature (such as 30° C. of environmental temperature), the Tco compensate parameter is obtained. As the initial voltage V1 is already obtained, the optimum V2 may be calculated according to the formula V2=V1+f(Tco) above.

Since wordlines which are located close to each other have relatively less temperature coefficient difference, several wordlines may share a compensate temperature coefficient. As a result, in the embodiment wordlines within each boundary may share a compensate temperature coefficient.

By compensating temperature coefficient with respect to a plurality of wordlines divided by borders, the invention achieves the function of flexible compensation, and obtains more accurate wordline voltages.

It should be noted that, two variable Tco borders are just an example, a skilled person in the art may vary according to different situation, such as one Tco border, more than three Tco border et, al.

Furthermore, the temperature coefficient compensate may be enabled or disabled. A border enable parameter may be stored in power-on read blocks 10 of the NAND flash memory. When it is detected the enable parameter is, for example, 0, it means the temperature coefficient compensate should be enabled. Whether to enable the temperature coefficient compensate may be set by manufacturers or users.

As shown in FIG. 2, with respect to 64 wordlines WL0 to WL63, four variable Tco zones, which are zone 0, zone 1, zone 2 and zone3 are disposed for setting flexible temperature coefficients.

Each zone is formed of 16 wordlines. In the embodiment, the wordlines WL0 to WL15 are in zone 0; the wordlines WL16 to WL31 are in zone 1; the wordlines WL32 to WL47 are in zone 2; the wordlines WL48 to WL63 are in zone 3.

In zone 1, Tco compensate parameter may be set as 0, and in zone 2, Tco compensate parameter may be represented by "VTCO_Z1", in zone 3, Tco compensate parameter may be represented by "VTCO_Z2", in zone 4, Tco compensate parameter may be represented by "VTCO_Z3".

VTCO_Z1 to VTCO_Z3 may be positive or negative, which are not limited. VTCO_Z1 and VTCO_Z3 may be determined in factory test.

Similarly, in the factory test period, the Tco compensate parameter for read voltage and the Tco compensate parameter for program verify voltage of a wordline under different temperatures are tested by the abovementioned way, which is not illustrated.

Which area is a wordline located may be determined by a determining procedure when the NAND flash memory is powered on. For example, in the determining procedure, a comparison is performed between the wordline and corresponding scope of the zone. After comparison, the area in which the wordline is located it is determined.

Furthermore, the temperature coefficient compensate may be enabled or disabled. A zone enable parameter may be stored in power-on read blocks 10 of the NAND flash memory. When it is detected the zone enable parameter is, for example, 0, it means the temperature coefficient compensate should be enabled. Whether to enable the temperature coefficient compensate may be set by manufacturers or users.

In some embodiments, both the zone enable parameter and the border enable parameter are stored in the power-on read blocks 10, but they are not used at the same time.

As discussed above, by compensating temperature coefficient with respect to the wordlines divided by zones, the invention achieves the function of flexible compensation, and obtains more accurate wordline voltages.

Many details are discussed in the specification provided herein. However, it should be understood that the embodiments of the disclosure may be implemented without these specific details. In some examples, the well-known methods, structures and technologies are not shown in detail so as to avoid an unclear understanding of the description.

It should be noted that the above-described embodiments are intended to illustrate but not to limit the present application, and alternative embodiments may be devised by the person skilled in the art without departing from the scope of claims as appended. In the claims, any reference symbols between brackets form no limit of the claims. The wording "include" does not exclude the presence of elements or steps not listed in a claim. The wording "a" or "an" in front of an element does not exclude the presence of a plurality of such elements. The disclosure may be realized by means of hardware comprising a number of different components and by means of a suitably programmed computer. In the unit claim listing a plurality of devices, some of these devices may be embodied in the same hardware. The wordings "first", "second", and "third", etc. do not denote any order. These wordings may be interpreted as a name.

Also, it should be noticed that the language used in the present specification is chosen for the purpose of readability and teaching, rather than explaining or defining the subject matter of the present application. Therefore, it is obvious for an ordinary skilled person in the art that modifications and variations could be made without departing from the scope and spirit of the claims as appended. For the scope of the present application, the publication of the inventive disclosure is illustrative rather than restrictive, and the scope of the present application is defined by the appended claims.

What is claimed is:

1. A NAND flash memory with wordline voltage compensate, comprising:
   a plurality of wordlines, wherein each of the plurality of wordlines corresponds to a wordline voltage with a compensated temperature coefficient, wherein the plurality of wordlines are divided into a plurality of groups, each group corresponds to the compensated temperature coefficient, wherein the each wordline corresponds to a wordline address, and the groups of wordlines are divided by at least a border according to wordline addresses;
   wherein the NAND flash memory further comprises a power-on read block storing a border enable parameter for enabling or disabling the compensated temperature coefficient.

2. The NAND flash memory with wordline voltage compensate according to claim 1, wherein the plurality of wordlines are divided into three groups by two borders, each of the three groups corresponds to the compensated temperature coefficient.

3. A NAND flash memory with wordline voltage compensate, comprising:
   a plurality of wordlines, wherein each of the plurality of wordlines corresponds to a wordline voltage with a compensated temperature coefficient, wherein the plurality of wordlines are divided into a plurality of groups, each group corresponds to the compensated temperature coefficient, wherein the groups of wordlines are divided by zones, each zone includes at least one wordline;
   wherein the NAND flash memory further comprises a power-on read block storing a zone enable parameter for enabling or disabling the compensated temperature coefficient.

4. The NAND flash memory with wordline voltage compensate according to claim 3, wherein said each zone includes 16 wordlines, and four zones are applied.

* * * * *